United States Patent
Zhuang et al.

(10) Patent No.: US 6,757,337 B2
(45) Date of Patent: Jun. 29, 2004

(54) CODING-ASSISTED MIMO JOINT DETECTION AND DECODING

(75) Inventors: Xiangyang Zhuang, Hoffman Estates, IL (US); Frederick Vook, Schaumburg, IL (US)

(73) Assignee: Motorola, Inc., Schaumburg, IL (US)

( * ) Notice: Subject to any disclaimer, the term of this patent is extended or adjusted under 35 U.S.C. 154(b) by 25 days.

(21) Appl. No.: 10/235,895

(22) Filed: Sep. 5, 2002

(65) Prior Publication Data

US 2004/0047438 A1 Mar. 11, 2004

(51) Int. Cl.[7] ............................. H04L 27/06; H04L 1/02
(52) U.S. Cl. ........................................ 375/267; 375/240
(58) Field of Search ................................ 375/267, 340, 375/341, 347, 224, 227; 714/774

(56) References Cited

U.S. PATENT DOCUMENTS 6,560,744 B1 * 5/2003 Burshtein ................... 714/774
2003/0103584 A1 * 6/2003 Bjerke et al. ............... 375/340
2003/0123381 A1 * 7/2003 Zhuang et al. .............. 370/208
2004/0001564 A1 * 1/2004 Chan et al. ................. 375/341

* cited by examiner

Primary Examiner—Don N Vo
(74) Attorney, Agent, or Firm—Kenneth A. Haas

(57) ABSTRACT

To address the need for a receiver that provides good performance during poor channel conditions yet reduces the computational complexity of existing ML receivers, a method and apparatus for MIMO joint detection and decoding is provided herein. In accordance with the preferred embodiment of the present invention, a low-complexity linear filter method is first utilized by the receiver. However, a higher-complexity non-linear method is utilized when the performance of the linear method is not adequate, for example, during poor channel conditions. In order to reduce the complexity of the non-linear decoding method, the distances to a much smaller set of candidate constellation points are computed than with prior-art decoding methods. This is made possible by the fact that some bits decoded with higher confidence utilizing the output of a linear filter method can help the decoding of the other bits.

15 Claims, 2 Drawing Sheets

US 6,757,337 B2

CODING-ASSISTED MIMO JOINT DETECTION AND DECODING

FIELD OF THE INVENTION

The present invention relates generally to decoding information within communication systems and in particular, to a method for Multiple-Input-Multiple-Output (MIMO) detection and decoding within such communication systems.

BACKGROUND OF THE INVENTION

Since wireless spectrum has become such a precious shared resource, higher spectral efficiency than state-of-the-art systems will likely be mandatory in future systems that are required to deliver higher data rates. It is well recognized that the Multiple-Input-Multiple-Output (MIMO) technique has the potential of greatly increasing spectral efficiency, but the gain comes at the price of more processing power at the receiver due to the task of separating signals that are simultaneously transmitted from multiple antennas. This fact is especially true for the optimal maximum likelihood (ML) receiver (which has the best performance among all receive methods) in that it has an exponential computational complexity of $Q^{M_T}$ for a modulation symbol constellation size of Q and $M_T$ transmit antennas. The optimal ML receiver needs to compute $Q^{M_T}$ distances between the actual received signal vector (formed from the received signals on all the receive antennas) and each of the $Q^{M_T}$ noise-free signal vectors that correspond to the $Q^{M_T}$ possible hypotheses for the transmitted symbol vector (i.e., a vector of constellation points). It is critical to reduce the complexity before an ML receiver can be used in systems using large Q and/or large $M_T$.

Existing MIMO receive algorithms include non-linear ones like the above-mentioned ML receiver, and linear ones such as Minimum Mean Square Error (MMSE) and Zero Forcing (ZF) filters. While an ML receiver tries to jointly detect all $M_T$ transmitted symbols at once at the cost of $Q^{M_T}$ distance computations, a linear receiver first separates out the $M_T$ transmitted symbols and provides $M_T$ symbol estimates, based on which only $QM_T$ distance computations are needed. While linear techniques often require much less processing power than non-linear techniques, these techniques may not perform very well in some cases, such as when the noise power is high or when the channel matrix is not so well-conditioned (i.e., under poor channel conditions). On the other hand, while the ML receiver is generally more robust than linear receivers, the computational complexity of ML receivers may prohibit their implementation. Therefore, a need exists for a receiver that provides good performance in poor channel conditions yet has significantly less computational complexity than existing ML receivers.

DETAILED DESCRIPTION OF THE DRAWINGS

Figure 1:
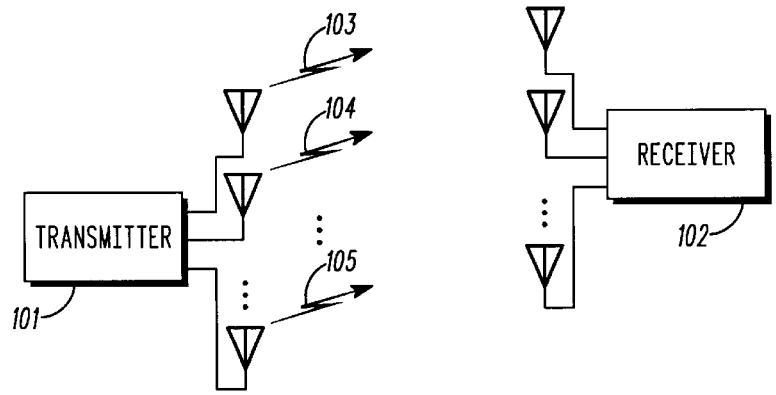
FIG. 1 is a block diagram of a communication system in accordance with the preferred embodiment of the present invention.

To address the need for a receiver that provides good performance while providing a lower computational complexity than existing ML techniques, a method and apparatus for MIMO joint detection and decoding is provided herein that performs both MIMO symbol separation and decoding. In accordance with the preferred embodiment of the present invention, a low-complexity linear filter method is first utilized by the receiver. However, a higher-complexity non-linear method is utilized when the decoded performance of the linear method is not adequate, for example, during poor channel conditions. In order to reduce the complexity of the non-linear decoding method, the receiver computes a set of distances (corresponding to candidate transmitted symbol vectors), the number of which is much smaller than what is computed with the prior-art ML method. This is made possible by the fact that some bits decoded with higher confidence (e.g., decoded by utilizing the output of a linear filter method) can help the quality value computations for the other bits, thereby eliminating the need to compute all of the $Q^{M_T}$ possible distances.

By utilizing the non-linear method only when necessary, and additionally by re-computing bit quality values based on a much smaller set of candidate symbol vectors (in case that a non-linear method is necessary), the proposed technique has near maximum likelihood performance, but with a significantly reduced computational complexity.

The present invention encompasses a method comprising the steps of receiving a signal stream and utilizing a first algorithm to estimate symbol values from the signal stream and determine first bit quality values from the estimated symbol values, attempting to decode the symbol stream based on the first bit quality values, and producing second bit quality values from the attempt to decode the symbol stream. A second algorithm is utilized to determine third bit quality values from the signal stream, wherein the third bit quality values are determined based on the second bit quality values, and finally a further attempt to decode the symbol stream is made utilizing the third bit quality values.

The present invention additionally encompasses a method comprising the steps of receiving a signal stream and utilizing a linear receive algorithm to estimate symbol values from the signal stream determining first bit quality values from the estimated symbol values, and utilizing a non-linear receive algorithm to determine second bit quality values from the symbol stream. The first and the second bit quality values are passed to a decoder and decoded bits are produced based on the first and the second bit quality values.

The present invention encompasses an apparatus comprising a first receiver having a signal stream as an input and outputting first bit quality values, a second receiver having the signal stream as an input and outputting second bit quality values, and a decoder receiving the first and the second bit quality values and outputting decoded bits based on the first and the second bit quality values.

Turning now to the drawings, wherein like numerals designate like components, FIG. 1 is a block diagram of communication system 100 in accordance with the preferred embodiment of the present invention. In the preferred embodiment of the present invention, communication system utilizes a Multiple-Input-Multiple-Output (MIMO) technique which belongs to a class of techniques whose theoretical capacity was predicted in G. J. Foschini and M. J. Gans, "On limits of wireless communications in a fading environment when using multiple antennas", *Wireless Personal Communications*, vol. 6, pp. 311–335, March 1998.

With such a system the transmission of multiple data streams 103–105 is transmitted from transmitter 101 to receiver 102 over multiple antennas.

As described above, while MIMO transmission has the potential of greatly increasing spectral efficiency, the gain comes at the price of more processing power at receiver 102 due the task of separating signals that are simultaneously transmitted from multiple antennas 103–105. In order to reduce the processing needed at receiver 102, in the preferred embodiment of the present invention multiple receiving algorithms are utilized within receiver 102. In particular, a low-complexity linear filter method is first utilized followed by a modified higher-complexity non-linear method. In order to reduce the complexity of the non-linear receive method, the distances between the received signal and a much smaller set of candidate symbol vectors are computed. This is made possible by utilizing bit quality values supplied by the decoder function to help in the subsequent non-linear receive processing. The receiver 102 is illustrated in FIG. 2.

Figure 2:
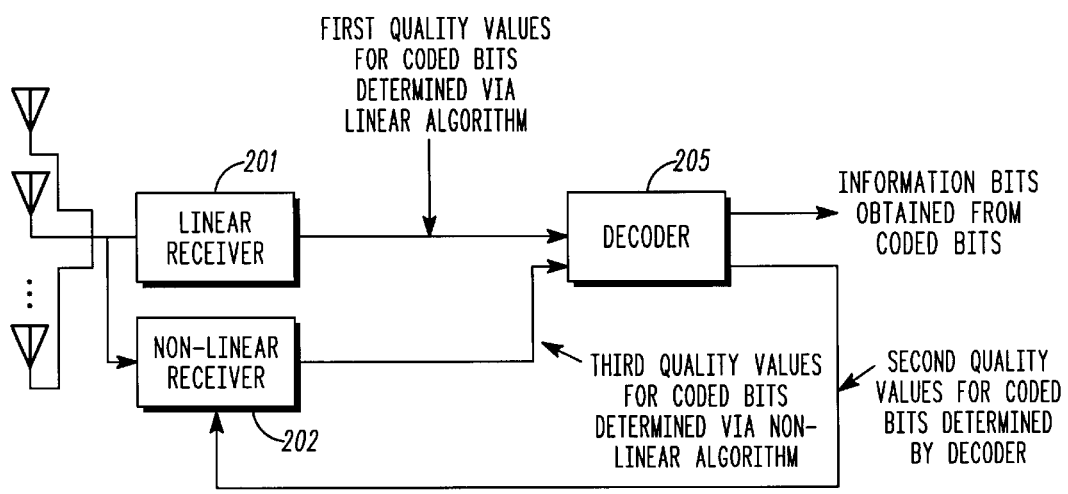
FIG. 2 is a block diagram of the receiver of FIG. 1 in accordance with the preferred embodiment of the present invention.

FIG. 2 is a block diagram of the receiver of FIG. 1 in accordance with the preferred embodiment of the present invention. As shown, receiver 102 comprises linear receiver 201, non-linear receiver 202, and decoder 205. It is contemplated that the elements within receiver 102 are configured in well known manners with processors, memories, instruction sets, and the like, which function in any suitable manner to perform the function set forth herein.

Linear receiver 201 utilizes a low-complexity linear approach such as the MMSE or ZF filters for estimating the $M_T$ symbol sequences. Such receiving techniques are well-known in the art. Linear receiver 202 is required to provide bit quality values that can be derived from the $M_T$ symbol sequences. The MMSE and ZF methods are described in detail in the "MIMO algorithm" subsection below. Additionally, non-linear receiver 202 is a reduced-complexity version of a higher-complexity maximum-likelihood (ML) approach. The standard ML approach is also well known in the art although it makes hard decisions on the symbols, instead of providing bit quality values. The ML receiver will also be described in detail in the "MIMO algorithm" subsection below where it computes bit quality values instead of makes hard decisions. In alternate embodiments, the non-linear algorithm may utilize other non-linear approaches, such as, but not limited to the sphere decoding algorithm.

Decoder 205 has the goal of detecting the information bits from the quality values of the coded bits. In addition, decoder 205 is preferably a decoder that is capable of providing some sort of likelihood information (also referred to as quality values) for the coded bits, with particular examples including a maximum probability (MAP) decoder, a soft-output Viterbi decoder, or a belief propagation algorithm used in a low-density parity check (LDPC) decoder. In the preferred embodiment of the present invention a maximum probability (MAP) decoder is utilized. Decoder 205 takes the quality values (Log Likelihood Ratios (LLRs)) of the coded bits as its input and returns the LLRs of the coded bits as one of its two outputs. (The other output is the decisions on information bits). For Decoder 205, the input and output LLRs of the coded bits are referred to as a priori and a posteriori LLRs, respectively. The a priori LLRs are first provided by linear receive 201. The a posteriori LLRs are used by the modified non-linear method 202 to reduce complexity. The output of non-linear receiver 202 is the refined a priori LLRs that will be used by decoder 205.

Prior to describing operation of receiver 102 the following text and equations are provided to set the necessary background for utilization:

MIMO Algorithm:
Assume the following MIMO data model $$x_k = H_k s_k + n_k \quad (1)$$

where $H_k$ is a $M_R \times M_T$ channel matrix, the $M_R \times 1$ vectors $x_k$ and $n_k$ are the received data and noise vector, respectively, and $s_k$ is the $M_T \times 1$ transmitted symbol vector. The subscript k generally denotes either the time instant or the subcarrier index such as in Orthogonal Frequency Division Multiplexing (OFDM), or both time and subcarrier. The transmitted symbol vector $s_k$ represents $qM_T$ bits for a symbol constellation size of $Q = 2^q$.

As an example, a turbo coded system is described here where the symbols in the sequence $\{s_k | k=0, \ldots, K\}$ are the result of turbo encoding an information bit sequence $\{u_n\}$ followed by bit-to-constellation symbol-mapping. The goal of receiver 102 is to recover $\{u_n\}$ directly while many existing algorithms aim at recovering $\{s_k\}$ first and then decoding. It is worthwhile to point out the difference between detecting $\{s_k\}$ and $\{u_n\}$. Detecting $\{s_k\}$ involves making hard decisions on the transmitted symbols, no matter if the decisions are made directly (e.g., in ML or Sphere Decoding algorithms) or based on symbol estimates (e.g., in linear receivers). If the ultimate goal is to determine $\{u_n\}$, then any attempt to make decisions on $\{s_k\}$ may be unhelpful (and therefore unnecessary) because likelihood information valuable to the decision-making process would be lost. For the purpose of decoding in the receiver 102, the receive methods utilized by both receivers 201 and 202 are required to provide decoder 205 with likelihood values (bit quality value) of every coded bit.

Linear receiver 201 is utilized by receiver 102 as an initial step to reduce the complexity of non-linear algorithm 202. Within receiver 201, $M_T$ receive filters (i.e., the rows of the matrix $W_k^H$ below) are applied to $x_k$ to obtain the estimate of a symbol vector $\hat{s}_k$, i.e., $$\hat{s}_k = W_k^H x_k \quad (2)$$

where $W_k^H$ denotes the conjugate transpose of the matrix $W_k$.

A ZF filter is computed as $$W_k = H_k^{-1}, \quad (3)$$

and an MMSE filter is computed as $$W_k = \left( H_k H_k^H + \frac{\sigma_n^2}{\sigma_s^2} I \right)^{-1} H_k. \quad (4)$$

After receiver 201 obtains $\hat{s}_k$, receiver 201 performs the bit log-likelihood ratio (LLR) computations based on $\hat{s}_k$. The LLR is related to the natural logarithm of the following bit likelihood that is derived from the likelihood values of the symbols $$P(\hat{s} | b_i) = \sum_{s \in S} P(\hat{s} | s) P(s | b_i) \quad i = 1, \ldots, q = \log_2 Q, \quad (5)$$

where the subscript k used before is omitted here for the sake of clarity, S is the set of Q constellation points, and $\hat{s}$ is the symbol estimate in $\hat{s}$ that contains the bit $b_i$. For each bit $b_i$, half of the constellation points in S will be involved in the computation of $P(\hat{s}|b_i=0)$, and the other half points contribute to $P(\hat{s}|b_i=1)$. Altogether the $P(\hat{s}|s)$ corresponding to all the Q constellation points must be computed. Since decoder 205, such as the MAP algorithm that may be used in turbo decoding, often operates in the log domain to reduce complexity, the log-domain operation "ln" (i.e., ln P(x|s)) is often used, as given in $$\ln P(\hat{s} \mid s) = c + \frac{|\hat{s} - h_e s|^2}{2\sigma_e^2}. \quad (6)$$

where $h_e$ is the equivalent channel coefficient including the effect of the channel and the linear receive processing, $\sigma_e^2$ is the effective post-receive processing noise power, and c is a constant which makes no contribution to the a priori LLR computation below $$\lambda_i = \ln P(\hat{s}|b_i=1) - \ln P(\hat{s}|b_i=0). \quad (7)$$

As seen in (6), $\ln P(\hat{s}|s)$ and thus the LLR, is essentially the squared distance $|\hat{s} - h_e s|^2$.

When computing LLRs (7) for Gray-encoded rectangular modulation, constellation symmetry can reduce the number of required distance computations. For example, with 16-QAM, only the distances from $\text{Re}(\hat{s}/h)$ to $\{-3,-1,1,3\}$ and from $\text{Im}(\hat{s}/h)$ to $\{-3,-1,1,3\}$ are needed in the computation of (7) because of the constellation symmetry. Compared with Q complex computations, the requirement of 2q real-valued computations represents a significant complexity reduction for large Q.

In both MMSE and ZF filtering, since the linear receive processing affects the effective output noise, this effect has to be accounted for in (6) where the "effective" noise power $\sigma_e^2$ should be used. For an MMSE receiver, there is also residual interference that can be modeled as Gaussian noise whose power can be added to the calculated value of the post-linear-processing noise power when computing the LLRs. If a filter shrinks or expands the constellation (e.g., MMSE filters), such scaling must be compensated for in the computation of likelihood values as well. These procedures can be very important to the decoded performance because the goal of a MIMO receiver here is to supply the turbo decoder with accurate likelihood information instead of correct decisions.

Unlike the linear approaches, an optimal non-linear ML receiver does not separately estimate the $M_T$ simultaneously transmitted symbols. Instead, all the $qM_T$ bits (q=log$_2$Q) probabilities are derived from the received signal vector directly, as given in $$P(x|b_i) = \Sigma_{s \in S} P(x|s) P(s|b_i) i = 1, \ldots, qM_T. \quad (8)$$

where the bold vectors x and s represent the received signal vector and the transmitted symbol vector, respectively.

Each P(x|s) still involves a distance computation of $\|x-Hs\|^2$, which is a vector distance now, and there are $Q^{M_T}$ possibilities in the set S. Therefore, a "full" non-linear method will have to compute $Q^{M_T}$ distances in order to provide the LLRs for $qM_T$ bits.

Once receiver 201 computed the a priori LLRs, decoder 205 will use them and return the a posteriori LLRs during its iterative decoding process. The a posteriori LLRs are used by the coding-assisted MIMO algorithms, which are now described.

Coding-Assisted (CA) MIMO Algorithms

In prior art ML receivers utilizing equation (8), there is no side information on each received bit (i.e., each bit is assumed to have equal probability of 1 and 0, which means $P(b_i=0)=P(b_i=1)=\frac{1}{2}$, for i=1 . . . $qM_T$). As a result, P(x|s) needs to be computed for each of the $2^{qM_T}$ possible s in (8).

As described above, this results in a very high computational complexity. In order to address this issue, in the preferred embodiment of the present invention the probability information for each coded bit, provided by decoder 205, is utilized, as the side information, by non-linear receiver 202 to eliminate calculating $P(x|s)P(s|b_i)$ for some transmitted symbol candidates (each of which is a vector of constellation points). This can be accomplished because the result of $P(x|s)P(s|b_i)$ for some s may be insignificant compared with the product for some other more likely s. Therefore, the computation of P(x|s) for the less likely s can be omitted. As an extreme example, if the receiver has one hundred percent confidence on those coded bits $b_i$ (i.e., $\pm\infty$ LLRs), then there is no need to compute any P(x|s) because it would be useless in making the decision (no decision is needed in this case since the bits are all known with complete confidence).

At the very beginning, the proposed coding-assisted algorithm starts with the a priori (first) LLRs ($\lambda_i$ of equation (7)) computed by the receiver 201, which computed those LLRs based on the outputs of the linear receiver 201. At some point in the decoding iterations (a turbo code is decoded iteratively) being performed by decoder 205 (say after the d-th iteration as discussed later on), a posteriori (second) LLRs are produced from the coded bits. The coding-assisted MIMO algorithm uses the a posteriori, or second, LLRs of the coded bits to re-compute the a priori LLRs and produce a third set of LLRs, which are then used by decoder 205 to finish the rest of the decoding iterations. To create the third LLR set, some of the LLRs in the first set are updated while the rest of the LLRs of the first set are kept unchanged. For other codes that do not require iterative decoding, the proposed algorithm can start after the completion of decoding, after which one more decoding process would be performed.

Figure 3:
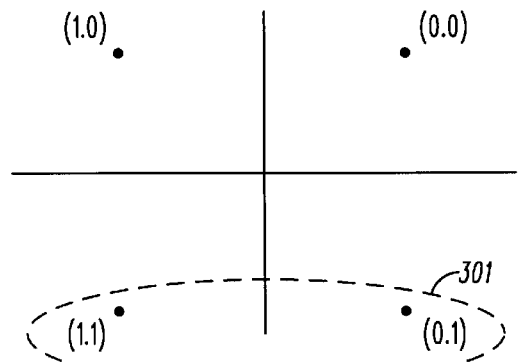
FIG. 3 illustrates a reduction in computational complexity in accordance with the preferred embodiment of the present invention.

FIG. 3. illustrates how computational complexity can be reduced by utilizing a posterior, or second, LLRs of the coded bits. For simplicity, and assuming the transmitted symbol vector has only one symbol or $M_T$=1, FIG. 3 shows a typical constellation containing 4 points, having associated bit representations of $(b_1,b_2)$=(0,0), (1,0), (1,1), and (0,1). As discussed above, in prior-art systems P(x|s) needs to be computed for each of the $2^{qM_T}$ possible vectors s in order to determine bit likelihoods. However, unlike the prior art, the a posteriori LLR information returned from decoder 205 is utilized by the receiver 202 to eliminate certain constellation points from this calculation. More particularly, the LLR information can be used to derive $P(b_i=0)$ and $P(b_i=1)$ in the non-linear receiver 202, where i=1, 2 for this example. (Note that the quantities $P(b_i=0)$ and $P(b_i=1)$ can easily be computed from the LLR information because $P(b_i=0)+P(b_i=1)=1$ and their ratio in the log domain is equal to the LLR). From this information (i.e., the quantities $P(b_i=0)$ and $P(b_i=1)$), receiver 202 eliminates calculating P(x|s) for symbols having low probabilities. For example, assume in FIG. 3 that it was determined from the LLR information that $P(b_2=1)$ was low (that is, the probability that $b_2=1$ is low). From this information algorithm 202 can eliminate calculating P(x|s) $P(s|b_i)$ for all constellation values where $b_2=1$. Thus, those constellation values circled 301 (i.e., where $b_2=1$) can be eliminated from consideration (that is, the distances to those constellation points need not be calculated), thereby greatly reducing complexity. Thus, non-linear receiver 202 calculates $P(x|s)P(s|b_i)$ for those constellation values where $b_2=0$, and the results are used to compute the bit LLRs for bits other than $b_2$ (i.e., $b_1$ in this example).

Before further discussing how to re-compute the bit LLRs using the a posteriori LLRs, it is worthwhile to note that in decoder 205 the computation of a posteriori LLRs for coded bits is very similar to that for the information bits as in an ordinary turbo decoder where only the a posteriori LLRs for the information bits are computed. The same quantities α and β obtained through the forward and backward recursions are used, except the probability for a coded bit is the probability sum of all the trellis branches that give that output (coded) bit (1 or 0), instead of the sum over those associated with the input (information) bit. A generic MAP algorithm is described in S. Benedetto, et al, "A Soft-Input Soft-Output Maximum A Posteriori (MAP) Module to Decode Parallel and Serial Concatenated Codes," *TDA Report* 42-127, JPL, November 1996, which is referred to as the Soft-input Soft-output (SISO) module. It can provide the LLRs for both or either of the coded and information bits.

In the preferred embodiment of the present invention the SISO MAP module for a constituent convolutional decoder takes the a priori LLRs of coded bits λ(c;I) and a priori LLRs of the information bits λ(u;I), and returns the extrinsic LLRs of coded bits λ(c;O) and extrinsic LLRs of the information bits λ(u;O). Note that the a posteriori LLR is the sum of the extrinsic and a priori LLRs.

Now assuming there exists knowledge of the coded bit $P(b_i)$, the re-computation of LLRs is discussed here. After rewriting (8) as $$P(x|b_i) = \frac{\sum_{s \in S} P(x|s)P(s, b_i)}{P(b_i)} = \frac{\sum_{s \in S} P(x|s)[P(b_1)P(b_2)\ldots P(b_{qM_T})]}{P(b_i)} \quad i=1,\ldots,qM_T, \quad (9)$$

it can be seen that it is possible to omit the computation of P(x|s) for unlikely s (i.e., ones with small P(s)) with the hope that the value of P(x|s)P(s) has a negligible contribution to the summation in (9). So, the Coding-Assisted (CA) algorithm first determines the most likely candidate $s_{ML}$ and its associated likelihood value $LLR_{max}$. Then for each possible s the algorithm compares its likelihood value with $LLR_{max}$. If it is within some pre-specified threshold, which means that this candidate's contribution is not negligible in relation to that of the most likely candidate determined before, then the algorithm computes P(x|s). The likelihood $P(x|b_i)$ can be derived as in (9) after obtaining all the P(x|s) that need to be computed. In the preferred embodiment of the present invention $P(x|b_i)$ is updated as each P(x|s) is computed. (The operation described later gives the ratio of $P(x|b_i=1)/P(x|b_i=0)$ in log domain, which is the LLR.)

Figure 4:
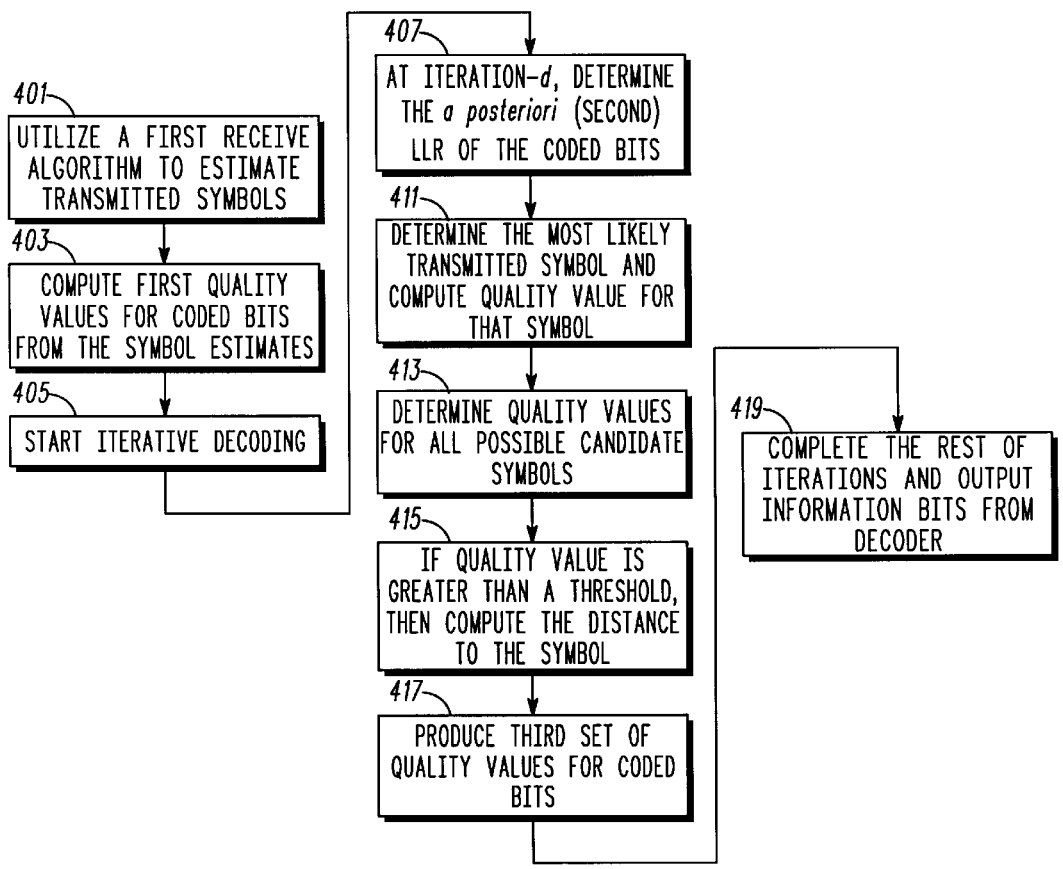
FIG. 4 is a flow chart showing operation of the receiver of FIG. 2 in accordance with the preferred embodiment of the present invention.

FIG. 4 is a flow chart showing operation of receiver 102 in accordance with the preferred embodiment of the present invention. The logic flow begins at step 401 where a first receive algorithm is utilized to estimate the transmitted symbols. As discussed above, in the preferred embodiment of the present invention a linear receive algorithm is utilized to estimate the symbol vector. Once the $M_T$ symbols are estimated, first quality values for the coded bits are determined by receiver 201 (step 403), and an attempt to decode the coded bits (via decoder 205) is started (step 405). As known in the art, decoder 205 utilizes an iterative method for decoding the coded bits, and as discussed above, during the attempt to decode the coded bits and after iteration d, a second set of quality values is determined by decoder 205 (step 407).

At step 411 non-linear receiver 202 determines the most likely transmitted symbols from the a posteriori, or second bit LLRs provided by decoder 205 and determines the quality value for that symbol. More particularly, based on coded bits a posteriori LLRs $\pi_i$, (i=1, ..., $qM_T$) after iteration d, the most likely transmitted symbol vector $s_{ML}$ is determined by determining each bit ("1" if $\pi_i>0$), and compute the associated symbol LLR as $$LLR_{max} = \sum_{i \in \{i|\pi_i \geq 0\}} \pi_i. \quad (10)$$

The logic flow continues to step 413 where the quality values for all possible candidate symbols are determined. More particularly, at step 413 $LLR_{s_j} = \sum_{i \in \{1, qM_T \text{ and } (i^{th} \text{ bit of binary } s_j)=1\}} \pi_i$ is computed for all j=1, ..., $2^{qM_T}$. The logic flow then continues to step 415 where particular distances to various constellation points are computed as in the non-linear method. As discussed above, in order to reduce computational complexity, only the distance to those $s_J$ having a high probability is computed. A third set of LLR or quality values of the coded bits is then produced (step 417) based on the particular distances to the selected $s_J$. More particularly, if $LLR_{s_J} > LLR_{max} - \eta_{thres}$ then $\ln P(x|s_J) = \|x - Hs_J\|^2/(2\sigma^2)$ is first computed (via receiver 202). Then additionally, for each $b_i$ ($i^{th}$ bit of the bit representation of $s_J$), where i=1, ..., $qM_T$, $\ln P(x|b_i)$ is updated as in $\ln P(x|b_i) = \max^*(\ln P(x|b_i), \ln P(x|s_J) + LLR_{s_J})$ which is derived from equation (9), where the "max*" operation is known in the art as defined by $\max^*(x,y) = \max(x,y) + \ln(1 + e^{-|x-y|})$ or other reduced-complexity variants of it. In option A: $\ln P(x|b_i)$ is updated as in $\ln P(x|b_i) = \max^*(\ln P(x|b_i), \ln P(x|s_J))$ to minimize the effect of possibly inaccurate $LLR_{s_J}$. Finally, the updated quality values or LLRs of the coded bits are recomputed as $\lambda_i = \ln P(x|b_i=1) - \ln P(x|b_i=0) - \pi_i$ as the third LLR set [or in option A: $\lambda_i = \ln P(x|b_i=1) - \ln P(x|b_i=0)$].

If either $\ln P(x|b_i=1)$ or $\ln P(x|b_i=0)$ does not exist in the above computation, set $\lambda_i = \lambda_i(c;i)$. The $\lambda_i = \lambda_i(c;i)$ operation is to set the new bit LLR to its original value for cases when $\ln P(x, b_i=1)$ or $\ln P(x, b_i=0)$ do not exist. The situation occurs when a $\pi_i$ (i.e., a posteriori LLR) is very large (i.e., with a very large likelihood in favor of one bit value, say "1"), then there may be no distance computation needed for the $s_J$ whose binary representation has the opposite bit (say "0") at that bit position because the threshold condition of $LLR_{s_J} > LLR_{max} - \eta_{thres}$ is not met. In an extreme case that all the coded bits are determined with high confidence after only the d-th iteration, the threshold condition can never be met, which means no non-linear computation is actually performed and the third LLR set is the same as the first LLR set.

Finally, the logic flow proceeds to step 419 where decoder 205 finishes the rest of iterations using the updated, or third set of LLRs and the information bits are determined. In particular, decoder 205 utilizes LLR information determined from both the linear and non-linear receivers to decode the coded bits, substituting the first LLRs of the "improperly decoded" bits with the updated, or third LLRs determined from the non-linear decoder after the d-th iteration.

As discussed above, a full non-linear decoding method computes all the distances to the various constellation points. Since in the preferred embodiment of the present invention only a partial set of distances is computed, computational complexity is greatly reduced. It should be noted that each distance computation in receiver 202 is computed as in the prior art; however fewer computations are made.

The threshold parameter $\eta_{thres}$ used in Step 415 is important in that it regulates how many distances are computed and thus the complexity, as well as the performance. The more distances computed, the more accurate are the LLRs, but the less computational saving is achieved. Ignoring the contribution from P(x|s) and looking at only P(s) for the moment, a gap of $\eta_{thres}=\eta_{gap}=3$ or 4 between $LLR_s$ and $LLR_{max}$ seems to be enough to ensure the omitted candidate has a negligible contribution from P(s), compared to $P(s_{ML})$ since $\exp(-3)=0.0498$ and $\exp(-4)=0.0183$. But P(x|s) for those less likely s can still be big enough (i.e., P(x|s)>P(x|$s_{ML}$)) to make the whole product P(x|s)P(s) non-negligible compared to $P(x|s_{ML})P(s_{ML})$, and this is especially the case when $s_{ML}$ determined in Step 411 is not the true symbol vector. Therefore, a two-part threshold determination approach is used by the preferred embodiment. After finding $s_{ML}$, the absolute value of $|\ln P(s|s_{ML})|$ computed in Step 411 is added to $\eta_{gap}$ to make the final $\eta_{thres}$. By designing the two-part threshold in the above way, the value of P(x|s)P(s) corresponding to any omitted candidate is guaranteed to be at most a small fraction (i.e., $\exp(-\eta_{gap})$) of $P(x|s_{ML})P(s_{ML})$ even if the candidates may have $|\ln P(x|s)|=0$ (which corresponds to the largest value (i.e., 1) a probability can be). The two-part threshold can also be decided adaptively; i.e., whenever a new $|\ln P(x|s)|$ is computed, it will be compared with the current $|\ln P(x|s_{ML})|$. If the new value is smaller, it will be used as the new $|\ln P(x|s_{ML})|$ that regulates the new $\eta_{thres}=\eta_{gap}+|\ln P(x|s_{ML})|$.

Another factor that affects the algorithm is the iteration d, after which the CA MIMO algorithm is performed. The choice is also a tradeoff. On one hand, if the turbo decoding iterations are going to converge, initiating CA-MIMO at a later time will achieve more savings as fewer distances need to be computed thanks to better knowledge of the coded bits. On the other hand, if the iterations are not converging, earlier initiation will prevent the incorrect LLRs of the coded bits provided by decoder 205 from selecting the wrong set of candidates.

Other considerations may include the choice of which kind of LLR is to be used (extrinsic or a posteriori) and how to use them. Of course, the a posteriori LLRs represent the best bit knowledge, but it is also feasible to use only the extrinsic LLR, especially if the original LLR provided by the linear MIMO algorithm is not deemed reliable. In the preferred embodiment of the present invention, option A described previously is a good choice in the LLR update process.

Different variations/modifications of the algorithm are possible with some performance tradeoffs. First, at least one distance must be computed (i.e., $|\ln P(x|s_{ML})|$) to obtain $\eta_{thres}$ even though it may eventually be found that no LLR needs to recomputed, especially at high SNRs. Presetting a fixed initial $\eta_{thres}$ can easily avoid this. Second, the LLRs of all the $Q^{M_T}$ candidates need to be computed as in $LLR_j=\Sigma_{i\in\{1,\ qM_T and\ (i^{th}\ bit\ of\ binary\ s_j)=1\}}\pi_i$ to compare with $LLR_{max}$, although only addition operations are involved there. To reduce the number of considered candidates and thus the number of computations, hard decisions on bits with "high" LLRs may be made by comparing them against a bit LLR threshold, thus excluding them from any further computation. Third, the candidates can be included in the LLR update one by one according to their LLRs in the descending order of their absolute values (i.e., from more likely to less likely). It will reduce the number of distances computed since the adaptively determined $\eta_{thres}$ may become tighter quickly. Also, if there is a limit on the maximum number of distance computations allowed in an implementation, it is always better to include those more likely candidates that may have a larger contribution in (9). However, the sorting of symbol LLRs not only involves the computation of LLRs for all the candidates but also requires a sorting function that may not be desirable in a hardware implementation. An ad-hoc sub-optimal alternative is to sort the bit LLRs instead and include first the candidates whose binary representations differ from that of the $s_{ML}$ at the bit positions where the LLRs are the smallest (i.e., the most ambiguous bits). Finally, in the case where too many bits out of $qM_T$ have very small LLRs, which can suggest a difficult channel with either an ill-conditioned matrix or a high noise level, the LLRs only for a few bits that have the smallest LLRs may be recomputed. In this case, no re-computation may be needed at all if there is a good chance that even the full ML method cannot provide good performance.

While the invention has been particularly shown and described with reference to a particular embodiment, it will be understood by those skilled in the art that various changes in form and details may be made therein without departing from the spirit and scope of the invention. For example, although the description of the preferred embodiment will be given above with respect to a MIMO system, the present invention is applicable where multiple digital signals experience different channels and add up at the receiver, or in the Multi-user Detection (MUD) problem of a CDMA uplink where the received signal is the superposition of the desired one and residual interference from other co-channel users. Other applications include Space Division Multiple Access (SDMA) and optimal maximum likelihood equalization. It is intended that such changes come within the scope of the following claims.

What is claimed is:

1. A method comprising the steps of:
   receiving a signal stream and utilizing a first algorithm to estimate symbol values from the signal stream and determine first bit quality values from the estimated symbol values;
   attempting to decode the symbol stream based on the first bit quality values;
   producing second bit quality values from the attempt to decode the symbol stream;
   utilizing a second algorithm to determine third bit quality values from the signal stream and the second bit quality values;
   further attempting to decode the symbol stream utilizing the third bit quality values.

2. The method of claim 1 wherein the step of utilizing the first algorithm to estimate symbol values comprises the step of utilizing a linear receive algorithm to estimate symbol values.

3. The method of claim 1 wherein the step of utilizing the second algorithm to determine third bit quality values comprises the step of utilizing a non-linear receive algorithm.

4. The method of claim 3 wherein the step of utilizing the non-linear receive algorithm comprises the steps of:
   selecting transmitted candidates for a non-linear computation based on the second quality values of coded bits;
   and producing the third bit quality values from the non-linear computation and the second bit quality values.

5. The method of claim 1 wherein the step of determining first, second, and third bit quality values comprises the step of determining first, second, and third bit log-likelihood ratios (LLRs).

6. The method of claim 1 wherein:
   the step of utilizing the first algorithm to estimate symbol values comprises the step of utilizing a linear receive algorithm to estimate symbol values; and
   step of utilizing the second algorithm to determine third bit quality values comprises the step of utilizing a modified non-linear receive algorithm.

7. A method comprising the steps of:

receiving a signal stream and utilizing a linear receive algorithm to estimate symbol values from the signal stream;

determining first bit quality values from the estimated symbol values;

utilizing a non-linear receive algorithm to determine second bit quality values from the symbol stream;

passing the first and the second bit quality values to a decoder; and producing decoded bits based on the first and the second bit quality values.

8. The method of claim 7 wherein the step of determining first bit quality values comprises the step of determining bit log-likelihood ratios (LLRs).

9. The method of claim 7 further comprising the steps of:

attempting to decode the estimated symbol stream; and utilizing the non-linear receive algorithm if the attempt to decode fails.

10. An apparatus comprising:

a first receiver having a signal stream as an input and outputting first bit quality values;

a second receiver having the signal stream as an input and outputting second bit quality values; and a decoder receiving the first and the second bit quality values and outputting decoded bits based on the first and the second bit quality values;

wherein the first and the second receiver comprise a linear and non-linear receiver, respectively.

11. The apparatus of claim 10 wherein the first receiver comprises a linear receiver.

12. The apparatus of claim 11 wherein the linear receiver comprises a MMSE receiver or a ZF filter.

13. The apparatus of claim 10 wherein the second receiver comprises a non-linear receiver.

14. The apparatus of claim 13 wherein the non-linear receiver comprises a maximum-likelihood receiver.

15. The apparatus of claim 10 wherein the first and second bit quality values comprise log-likelihood ratios (LLRs).

* * * * *